United States Patent
Chi et al.

[11] Patent Number: 5,917,748
[45] Date of Patent: Jun. 29, 1999

[54] MULTI-LEVEL DRAM SENSING SCHEME

[75] Inventors: Min-Hwa Chi; Hong-Hsiang Tsai, both of Hsinchu, Taiwan

[73] Assignee: Vanguard International Semiconductor Corporation, Hsin-Chu, Taiwan

[21] Appl. No.: 09/045,978

[22] Filed: Mar. 17, 1998

[51] Int. Cl.$^6$ ................................................. G11C 11/56
[52] U.S. Cl. ........................ 365/168; 365/149; 365/203; 365/210
[58] Field of Search .................................. 365/168, 149, 365/203, 210

[56] References Cited

U.S. PATENT DOCUMENTS

| | | | |
|---|---|---|---|
| 5,532,955 | 7/1996 | Gillingham | 365/149 |
| 5,612,912 | 3/1997 | Gillingham | 365/168 |
| 5,761,114 | 6/1998 | Bertin et al. | 365/168 |

OTHER PUBLICATIONS

T.Murotani et al, "A 4–Level Storage 4GB DRAM", International Solid State Circuit Conf. Digest of Technical Papers. TP 4.6 pp. 74–75, 1997.

*Primary Examiner*—Andrew Q. Tran
*Attorney, Agent, or Firm*—George O. Saile; Stephen B. Ackerman; Billy J. Knowles

[57] ABSTRACT

A multilevel DRAM sensing structure to detect the level of charge and interpret the digital data from a DRAM cell is disclosed. The multi-level sense amplifier structure has a first and second bit line each having a first and second section. A pair of isolation switch transistors separate the first section of the first bit line from the second section of the first bit line. The first section of the second bit line is separated from the second section of the second bit line by a second pair of isolation switch transistors. A latching sense amplifier has a first input connected to one of the pairs of isolation switch transistors, a second input connected to the other pair of isolation switch transistors, and an output connected to external circuitry. The output will have the digital data represented by the charge in the DRAM cell. A cross coupling capacitor is connected between the first section of the first bit line and the second section of the second bit line to couple a charge shift between the first section of the first bit line and the second section of the second bit line to distinguish the low order bit of the digital data. A control logic section is connected to the DRAM cells to control selection of each one DRAM cell, to the latching sense amplifier to control activation of the sense amplifier, and to the isolation switch transistors to control activation and deactivation of the isolation switch transistors.

11 Claims, 3 Drawing Sheets

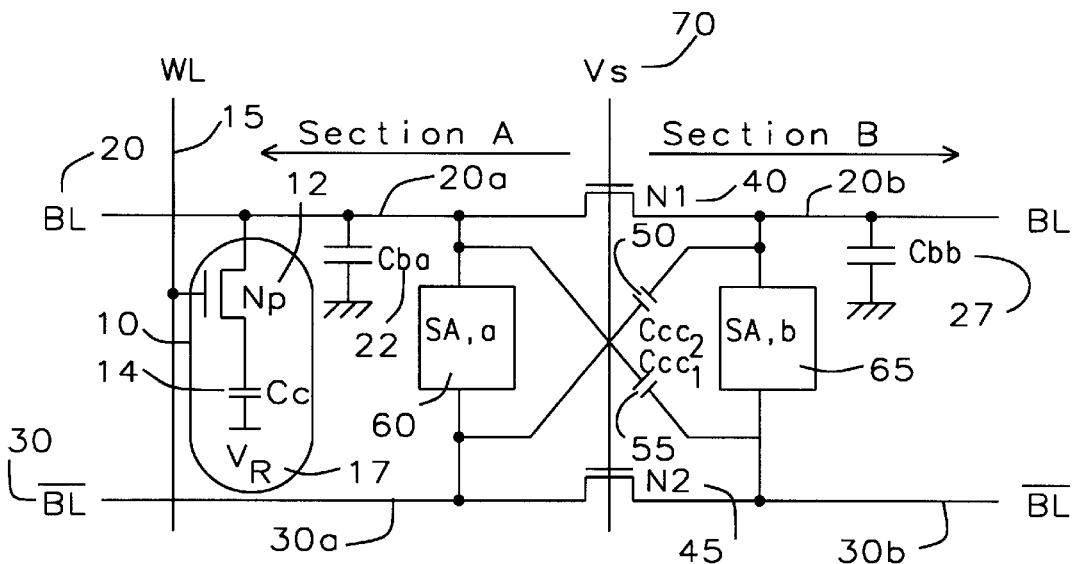
FIG. 1 — Prior Art
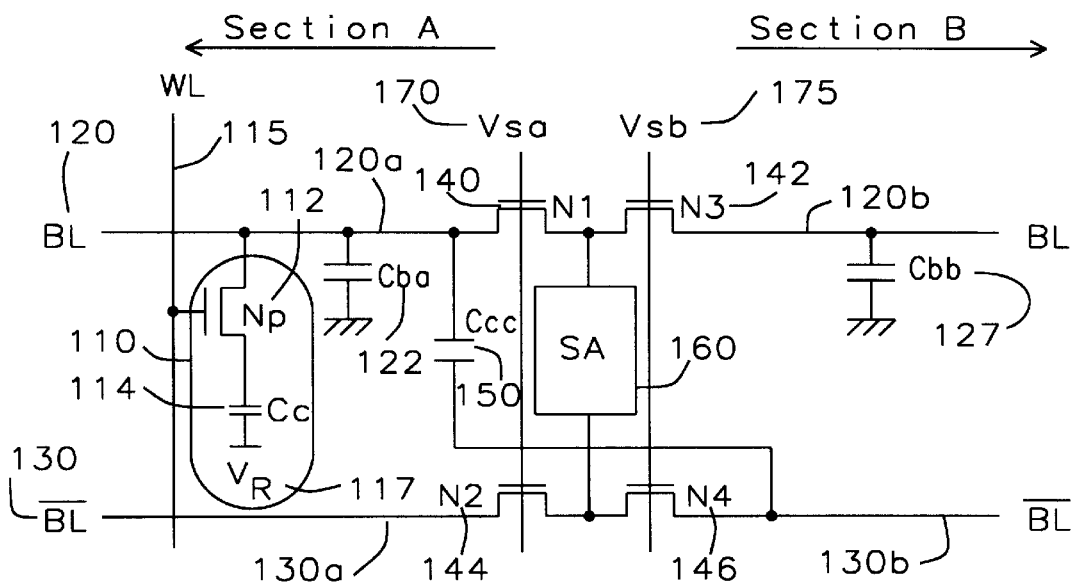
FIG. 2

MULTI-LEVEL DRAM SENSING SCHEME

FIELD OF THE INVENTION

This invention relates to dynamic random access memories (DRAM), and more particularly to the sensing of a level of charge within a DRAM cell, determining the digital data represented by the level of charge and restoring the level of charge to the DRAM cell subsequent to the determining the digital data.

DESCRIPTION OF RELATED ART

Storage of multiple bits of binary digital data within one DRAM cell is accomplished by placing discrete levels of charge on a capacitor within a DRAM cell. An example would be placing four levels of charge in the storage capacitor by using four bit-line voltage levels, $V_{cc}$, $\frac{2}{3}V_{cc}$, $\frac{1}{3}V_{cc}$, and GND during the write operation (where $V_{cc}$ is the power supply voltage source and GND is the ground reference point) represent the four binary digits of two bits of digital data. In order to ensure these levels of charge are properly sensed and converted to the voltage levels representing the two bits of digital data, the DRAM cell capacitor needs to be three times larger than if used for two-level (i.e. single bit) storage.

"A 4-level storage 4 Gb DRAM", T. Murotani et al., International Solid state Circuit Conference Digest of Technical Papers, TP4.6, p. 74, 1997, as shown in FIG. 1, describes a four-level sensing scheme of two bits of digital data from a single DRAM cell. The DRAM cell 10 consists of the pass transistor $N_p$ 12 and cell capacitor $C_c$ 14. The gate of the pass transistor $N_p$ 12 is connected to the word line WL 15. Control logic (not shown) will place appropriate voltage levels on the word line WL 15 to activate and deactivate the pass transistor $N_p$ 12 to control the flow of charge into and out of the cell capacitor $C_c$ 14. The discrete levels of charge placed on the capacitor $C_c$ 14 will be determined by discrete voltage levels placed on the bit line BL 20. The voltage of the reference voltage source $V_R$ 17 is typically biased to a voltage level that is one half of the power supply voltage source ($V_{cc}/2$).

To write digital data to the DRAM cell 10, the bit line BL 20 will be placed at appropriate voltage levels ($V_{cc}$, $\frac{2}{3}V_{cc}$, $\frac{1}{3}V_{cc}$, and GND) representing the two bits of digital data. The word line WL 15 will be placed at an appropriate voltage level to activate the pass transistor $N_p$ 12. The cell capacitor will then charge to the level of charge representative of the two bits of digital data.

To retain the level of charge on the cell capacitor $C_c$ 14, the pass transistor $N_p$ 12 is then deactivated.

The bit line BL 20 is divided into two sections 20a and 20b by the Metal Oxide Semiconductor (MOS) transistor $N_1$ 40 and likewise, the bit line $\overline{BL}$ 30 is divided into two sections 30a and 30b by the MOS transistor $N_2$ 45. The gates of the MOS transistors $N_1$ 40 and $N_2$ 45 are connected to the select voltage source $V_s$ 70. The select voltage source $V_s$ 70 will have voltage levels that will activate and deactivate the MOS transistors $N_1$ 40 and $N_2$ 45. A first sense amplifier SA,a 60 will be connected between the A sections 20a and 30a of the bit line BL 20 and the bit line $\overline{BL}$ 30. A second sense amplifier SA,b 65 will be similarly connected between the B sections 20b and 30b of the bit line BL 20 and the bit line $\overline{BL}$ 30.

A first cross coupling capacitor $C_{cc1}$ 55 is connected between the A section 20a of the bit line BL 20 and the B section 30b of the bit line $\overline{BL}$ 30 and a second cross coupling capacitor $C_{cc2}$ 50 is connected between the A section 30a of the bit line $\overline{BL}$ 30 and the B section 20b of the bit line BL 20.

The capacitors $C_{ba}$ 22 and $C_{bb}$ 27 represent the capacitance of the bit line BL 20. The placement of the MOS transistor $N_1$ 40 is such that the A section of the bit line BL 20 is twice the length of the B section of the bit line BL 20 and thus the capacitor $C_{ba}$ 22 is twice that of the capacitor $C_{bb}$ 27.

The read cycle of the DRAM cell 10 is hereinafter described. During a standby cycle, the bit line BL 20 and the bit line $\overline{BL}$ 30 are precharged to a voltage level that is one half the power supply voltage source ($V_{cc}/2$). The read cycle is then started by placing a voltage on the word line WL 15 that will activate the pass transistor $N_p$ 12 to select the DRAM cell 10. The pass transistor $N_p$ 12 will turn on and conduct the charge present on the cell capacitor $C_c$ 14 to the bit line BL 20. The charge from the DRAM cell 10 is then distributed on the A section and the B section of the bit line BL 20. The smallest charge packet from the DRAM cell 10 is $\frac{1}{6}V_{cc}C_c$, when the stored charge level was $\frac{2}{3}V_{cc}$ or $\frac{1}{3}V_{cc}$ with the bit line BL 20 precharged to a voltage level that is one half the power supply voltage source ($V_{cc}/2$). The MOS transistors $N_1$ 40 and $N_2$ 45 are then deactivated to isolate the A sections 20a and 30a of the bit line BL 20 and the bit line $\overline{BL}$ 30 from the B sections 20b and 30b of the bit line BL 20 and the bit line $\overline{BL}$ 30.

The first sense amplifier SA,a 60 is a latching sense amplifier of a type that is well known in the art. The output of the first sense amplifier SA,a 60 is the most significant bit (MSB) of the two bits of digital data. The first sense amplifier SA,a 60 will also force the first section 20a of the bit line BL 20 to a voltage level that is the level of the ground reference point (GND), if the charge level on the cell capacitor $C_c$ 14 is representing a first logic level (0) of the MSB of the digital data or to a voltage level that is the level of the power supply voltage source ($V_{cc}$), if the level of charge on the cell capacitor $C_c$ 14 is representing a second logic level (1) of the MSB of the digital data.

The A section 30a of the bit line $\overline{BL}$ 30 will be forced to the opposite voltage level of the A section 20a of the bit line BL 20. Thus if the A section 20a of the bit line BL 20 is at the level of the power supply voltage source ($V_{cc}$), the A section 30a of the bit line $\overline{BL}$ 30 will be at the voltage level of the ground reference point (GND).

When the sense amplifier SA,a 60 has changed the voltage levels on the A section 20a and 30a of the bit line BL 20 and the bit line $\overline{BL}$ 30, the charge present on the B sections 20b and 30b will be shifted by the coupling of the voltage levels through the cross coupling capacitors $C_{cc1}$ 55 and $C_{cc2}$ 50.

To distinguish the charge representative of the least significant bit (LSB), the charge shift within the B section 20b and 30b of the bit line BL 20 and the bit line $\overline{BL}$ 30 needs to be precisely:

$$(\tfrac{1}{3})(\tfrac{1}{6})(V_{cc})C_c.$$

Where the factor (1/3) is the ratio of the length of the B section 20b and 30b of the bit line BL 20 and the bit line $\overline{BL}$ 30 to the total length of the bit line BL 20 and the bit line $\overline{BL}$ 30. The factor ($\frac{1}{6}V_{cc}C_c$) is the smallest charge from the DRAM cell 10 on the bit line BL 20. The charge shift from the coupling capacitor $C_{cc}$ will be $$(\tfrac{1}{2})(V_{cc})C_{cc}.$$

Therefore to achieve the desired charge shift the cross coupled capacitors $C_{cc1}$ 55 and $C_{cc2}$ 50 must have a value of capacitance equal to $\frac{1}{9}$ the cell capacitor $C_c$ 17.

After the charge shift has occurred the sense amplifier SA,b 65 is activated and the LSB of the digital data is placed on the output of the sense amplifier SA,b 65 in a manner similar to that of the sense amplifier SA,a 60. The sense amplifier SA,b 65 is also a latching sense amplifier and will place the B section 20b and 30b of the bit line BL 20 and the bit line $\overline{BL}$ 30 at the appropriate voltage levels (i.e. the level of the power supply voltage source $V_{cc}$ or the voltage level of the ground reference point GND), as above described for the sense amplifier SA,a 60.

The sense amplifier SA,b 65 is deactivated and the MOS transistors $N_1$ 40 and $N_2$ 45 and the pass transistor $N_p$ 12 are activated and the charge is restored to the cell capacitor $C_c$ 14 of the DRAM cell 10.

To maintain appropriate signal levels on the bit line BL 20, the cell capacitor $C_c$ 14 must have a capacitance value that is approximately three times that of a conventional DRAM cell containing only one bit of digital data.

A problem exists with the structure as described. If there is a second DRAM cell present on the B section 20b of the bit line BL 20, the coupling charge necessary to accomplish the charge shift needs to be double that of the above described structure in order to maintain the correct level of signal shift to detect the LSB of the digital data.

A second problem with the above described structure is the requirement that the coupling capacitors $C_{cc1}$ 55 or $C_{cc2}$ 50 be ⅑ the value of the cell capacitor $C_c$ 14. Such capacitances are difficult to manufacture with precision.

U.S. Pat. Nos. 5,612,912 (Gillingham) and 5,532,955 (Gillingham) describe a multi-level DRAM, having four voltage levels and a method for processing the digital data stored in the multi-level DRAM cell. Each bit line is divided into two sub-bit lines, which are connected to respective sense amplifiers. Dummy cells that match the memory cells are provided on each sub-bit line to balance the capacitance of the sub-bit lines. The charge that is stored on each memory cell is dumped onto the sub-bit lines. The sub-bit lines are then isolated from each other. One of the sub-bit lines is then sensed to provide a sign bit. Dumping charge associated with the sign bit over the remaining sub-bit lines generates a reference voltage. The magnitude bit is sensed using the generated reference. The memory cell is restored by charge sharing the sign bit with the magnitude bit charge on one of the bit lines.

SUMMARY OF THE INVENTION

An object of this invention is to provide a structure to sense a level of charge within a DRAM cell and to interpret the level of charge as the appropriate multi-bit digital data represented by the level of charge.

Another object of this invention is to provide a multilevel DRAM sensing structure having a simple symmetrical structure to provide an equal detection margin to sense the level of charge and interpret the digital data.

To accomplish these and other object a multi-level sense amplifier structure has a first and second bit line each having a first and second section. A first isolation switch transistor is connected to the first section of the first bit line, and a second isolation switch transistor is connected to the second section of the first bit line. The first section of the second bit line is connected to a third isolation switch transistor, while the second section of the second bit line is connected a fourth isolation switch transistor.

A latching sense amplifier has a first input connected to a drain of each of the first and second isolation switch transistors, a second input connected to a drain of each of the third and fourth isolation switch transistors, and an output connected to external circuitry. The output will have the digital data represented by the charge in the DRAM cells as determined by a voltage level between the first and second inputs.

A cross coupling capacitor is connected between the first section of the first bit line and the second section of the second bit line to couple a charge shift between the first section of the first bit line and the second section of the second bit line to distinguish the low order bit of the digital data.

A control logic section is connected to the DRAM cells to control selection of each one DRAM cell, to the latching sense amplifier to control activation of the sense amplifier, and to a gate of each of the first, second, third, and fourth isolation switch transistors to control activation and deactivation of the first, second, third, and fourth isolation switch transistors.

The DRAM cell is read by the multi-level sense amplifier structure by first initializing the first and second bit lines. The first and second bit lines are initialized by placing the first, second, third, and fourth isolation switch transistors in an on state and precharging the first and second bit lines to a level that is one half a power supply voltage source during a standby time. The DRAM cell is then activated to transfer the level of charge present on the DRAM cell to a bit line attached to the DRAM cell.

Then a pair of isolation switch transistors connected to an opposite section of the first and second bit lines attached to the DRAM cell are deactivated to place the pair of isolation switch transistors in an off state. The latched sense amplifier is activated to sense the level of charge at the section of the bit line attached to the DRAM cell. The high order sensed data bit is placed at the output of the latched sense amplifier. A first voltage level that represents the high order sensed data bit is placed on the section of the bit line attached to the one DRAM cell and coupled through the cross coupling capacitor. This will cause a charge shift in the opposite section of the bit line not attached to the one DRAM cell to indicate the level of the high order sensed data bit. The pair of isolation switch transistors connected to the section of the first and second bit lines attached to the DRAM cell is deactivated to place the pair of isolation switch transistors in an off state. The pair of isolation switch transistors connected to an opposite section of the first and second bit lines attached to the DRAM cell is activated to place the pair of isolation switch transistors in an on state. The latched sense amplifier is activated to sense the level of charge at the section of the bit line not attached to the DRAM cell. The low order sensed data bit is then placed at the output of the latched sense amplifier representing the level of charge present within the DRAM cell. A second voltage level that represents the low order sensed data bit is placed on the section of the bit line not attached to the DRAM cell.

The latched sense amplifier is then deactivated, and the first, second, third, and fourth isolation switch transistors are activated to restore the level of charge to the DRAM cell. The DRAM cell is then deactivated.

BRIEF DESCRIPTION OF THE DRAWINGS

FIG. 1 is a schematic drawing of a four level sensing scheme of the prior art.

FIG. 2 is a schematic drawing of a first embodiment of a four level sensing scheme of this invention.

DETAILED DESCRIPTION OF THE INVENTION

Figure 3:
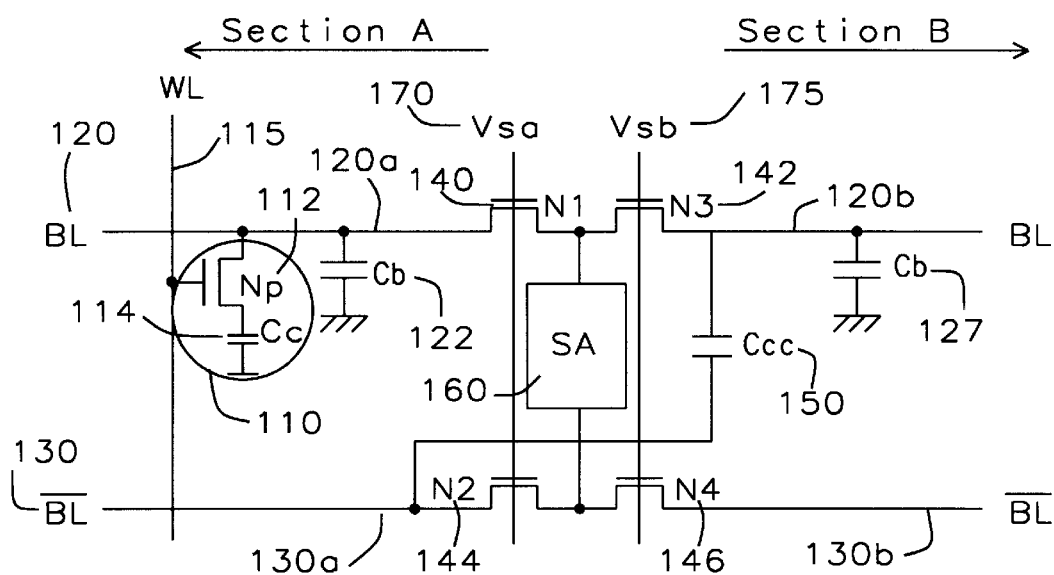
FIG. 3 is a schematic drawing of a second embodiment of a four level sensing scheme of this invention.

A first embodiment of a sensing scheme for a four level DRAM cell is shown in FIG. 2. A four level DRAM cell 110 consists of a pass transistor $N_p$ 112 and a cell capacitor $C_c$ 114. The cell capacitor $C_c$ 114 is connected between the drain of the pass transistor $N_p$ 112 and the reference voltage source $V_R$ 117. The source of the pass transistor $N_p$ 112 is connected to the bit line BL 120 and the gate of the pass transistor $N_p$ 112 is connected to the word line WL 115.

The DRAM cell 110 will be written as above described for the DRAM cell 10 of FIG. 1. The bit line BL 120 and the reference voltage source $V_R$ 117 will be set to the appropriate voltages to establish the level of charge representative of the two bits of digital data. The word line WL 115 will then be set to a voltage level that will activate the pass transistor $N_p$ 112 to place the correct level of charge on the cell capacitor $C_c$ 114.

The bit line BL 120 and the bit line $\overline{BL}$ 130 are divided into two sections, the A section 120a and 130a and the B section 120b and 130b. The isolation switch transistors $N_1$ 140 and $N_3$ 142 divide the A section 120a from the B section 120b of the bit line BL 120 and the isolation switch transistors $N_2$ 144 and $N_4$ 146 divide the A section 130a from the B section 130b of the bit line $\overline{BL}$ 130.

The source of the isolation switch transistor $N_1$ 140 is connected to the A section 120a of the bit line BL 120 and the source of the isolation switch transistor $N_3$ 142 is connected to section B 120b of the bit line BL 120. Similarly, the sources of the isolation switch transistors $N_2$ 144 and $N_4$ 146 are connected respectively to the A section 130a and the B section 130b of the bit line $\overline{BL}$ 130. The drains of the isolation switch transistors $N_1$ 140 and $N_3$ 142 are connected together as are the drains of the isolation switch transistors $N_2$ 144 and $N_4$ 146. The sense amplifier SA 160 is connected between the drain connection of the isolation switch transistors $N_1$ 140 and $N_3$ 142 and the drain connection of the isolation switch transistors $N_2$ 144 and $N_4$ 146.

The A section switch control voltage source $V_{SA}$ 170 is connected to the gates of the isolation switch transistors $N_1$ 140 and $N_2$ 144 to control activation of the isolation switch transistors $N_1$ 140 and $N_2$ 144. The B section switch control voltage source $V_{SB}$ 175 is connected to the gates of the isolation switch transistors $N_3$ 142 and $N_4$ 146 to control the activation and deactivation of the isolation switch transistors $N_3$ 142 and $N_4$ 146. The capacitor $C_{ba}$ 122 and $C_{bb}$ 127 represent the capacitances respectively of the A section 120a and the B section 120b of the bit line BL 120.

The method of the reading of the DRAM cell is hereinafter described as follows. The A section switch control voltage source $V_{SA}$ 170 and B section switch control voltage source $V_{SB}$ 175 are set to a voltage to activate the isolation switch transistors $N_1$ 140, $N_3$ 142, $N_2$ 144, and $N_4$ 146. The bit lines BL 120 and $\overline{BL}$ 130 are precharged to a voltage level equal to one half of the power supply voltage source ($V_{cc}/2$). This precharge is accomplished during a standby period prior to the commencement of the read cycle.

The read cycle begins by placing a voltage level on the word line WL 115 this is sufficient to activate the pass transistor $N_p$ 112. The level of charge present on the cell capacitor $C_c$ 114 will be transferred to the bit line BL 120.

The B section switch control voltage source $V_{SB}$ 175 will be set to a voltage level that will deactivate the isolation switch transistors $N_3$ 142 and $N_4$ 146. This will isolate the A sections 120a and 130a from the B sections 120b and 130b of the bit lines BL 120 and $\overline{BL}$ 130.

The latching sense amplifier SA 160 is now activated to sense the voltage difference between the A sections 120a and 130a of the bit lines BL 120 and $\overline{BL}$ 130. This voltage difference represents the level of charge present on the cell capacitor $C_c$ 114. The output of the latching sense amplifier SA 160 will assume a logic level (1 or 0) dependent on the level of charge on the cell capacitor $C_c$ 114. This logic level will be the most significant bit (MSB) of the two bit of the digital data, which is then transferred to external circuitry.

Further, the latching sense amplifier SA 160 will set the A sections 120a and 130a of the bit lines BL 120 and $\overline{BL}$ 130 to voltage level that are equal to either that of the power supply voltage source ($V_{cc}$) or the ground reference point (GND) according to the value of the sensed digital data.

The changing of the voltage on the A section 120a of the bit line BL 120 from the voltage level of one half of the power supply voltage source ($V_{cc}/2$) plus the level of charge present on the cell capacitor $C_c$ 114 to the level of the power supply voltage source ($V_{cc}$) or the ground reference point (GND) will be coupled to through the coupling capacitor $C_{cc}$ 150 to the B section 130b of the bit line $\overline{BL}$ 130. The necessary charge shift is $$(\tfrac{1}{2})(\tfrac{1}{3})V_{cc}C_c.$$

The factor of (1⁄2) is the ratio of the length of the B section 120b of the bit line BL 120 to the total length of the bit line BL 120. The charge ($\tfrac{1}{3}V_{cc}C_c$) is twice the minimum charge packet from the DRAM cell 120 than shown in the prior art of FIG. 1 (i.e. $\tfrac{1}{6}V_{cc}C_c$). Therefore, the cross coupling capacitor $C_{cc}$ 150 will have a capacitance value that is one third the capacitance value of the cell capacitor $C_c$ 114.

The latching sense amplifier SA 160 will be deactivated. The A section switch control voltage source $V_{SA}$ 170 will be placed at a voltage level to deactivate the isolation switch transistors $N_1$ 140 and $N_2$ 144. The isolation switch control voltage source $V_{SB}$ 175 will be placed at a voltage level to activate the isolation switch transistors $N_3$ 142 and $N_4$ 146. The B section 120b and 130b will thus be connected to the latching sense amplifier SA 160. The latching sense amplifier SA 160 is then activated to sense the difference in the voltage between the B sections 120b and 130b of the bit lines BL 120 and $\overline{BL}$ 130. This voltage difference will represent the least significant bit (LSB) of the two bits of digital data. The output of the latching sense amplifier will assume a logic level (1 or 0) dependent on the level of charge that was present on the cell capacitor $C_c$ 114. The LSB value will be transferred to external circuitry. The B sections 120b and 130b of the bit lines BL 120 and $\overline{BL}$ 130 will also be forced to levels of the power supply voltage source $V_{cc}$ or the ground reference point GND by the latching sense amplifier SA 160, dependent upon the voltage difference present on the B sections 120b and 130b of the bit lines BL 120 and $\overline{BL}$ 130.

The latching sense amplifier SA 160 will be deactivated. The cell capacitor $C_c$ 114 is then restored to its correct charge level by placing the A section switch control voltage source $V_{SA}$ 170 at a voltage level to activate the isolation switch transistors $N_1$ 140 and $N_2$ 144. The bit line BL 120 is then set to an appropriate discrete voltage level) $V_{cc}$, $\tfrac{2}{3}V_{cc}$, $\tfrac{1}{3}V_{cc}$, and GND) based on the data just read and stored in the external circuitry. The word line WL 115 will then be set to a voltage level that will activate the pass transistor Np 115 restore the correct charge to the cell capacitor $C_c$ 114.

The voltage present on the word line WL 115 will be set to deactivate the pass transistor $N_p$ 112. The bit line BL 120 and $\overline{BL}$ 130 will precharge to a voltage level the is one half the power supply voltage source ($V_{cc}/2$) and the cell will be in the standby mode.

FIG. 3 shows a second embodiment of the four level DRAM sensing structure. The fundamental structure is identical to that of FIG. 2 except the coupling capacitor is connected from the A section 130a of the bit line $\overline{BL}$ 130 to the B section 120b of the bit line BL 120. The operation is a described above for FIG. 2, except the charge shift will be of opposite polarity. This will cause the level of the voltage difference between the B sections 120b and 130b of the bit lines BL 120 and $\overline{BL}$ 130 to be identical but have different absolute levels.

Figure 4:
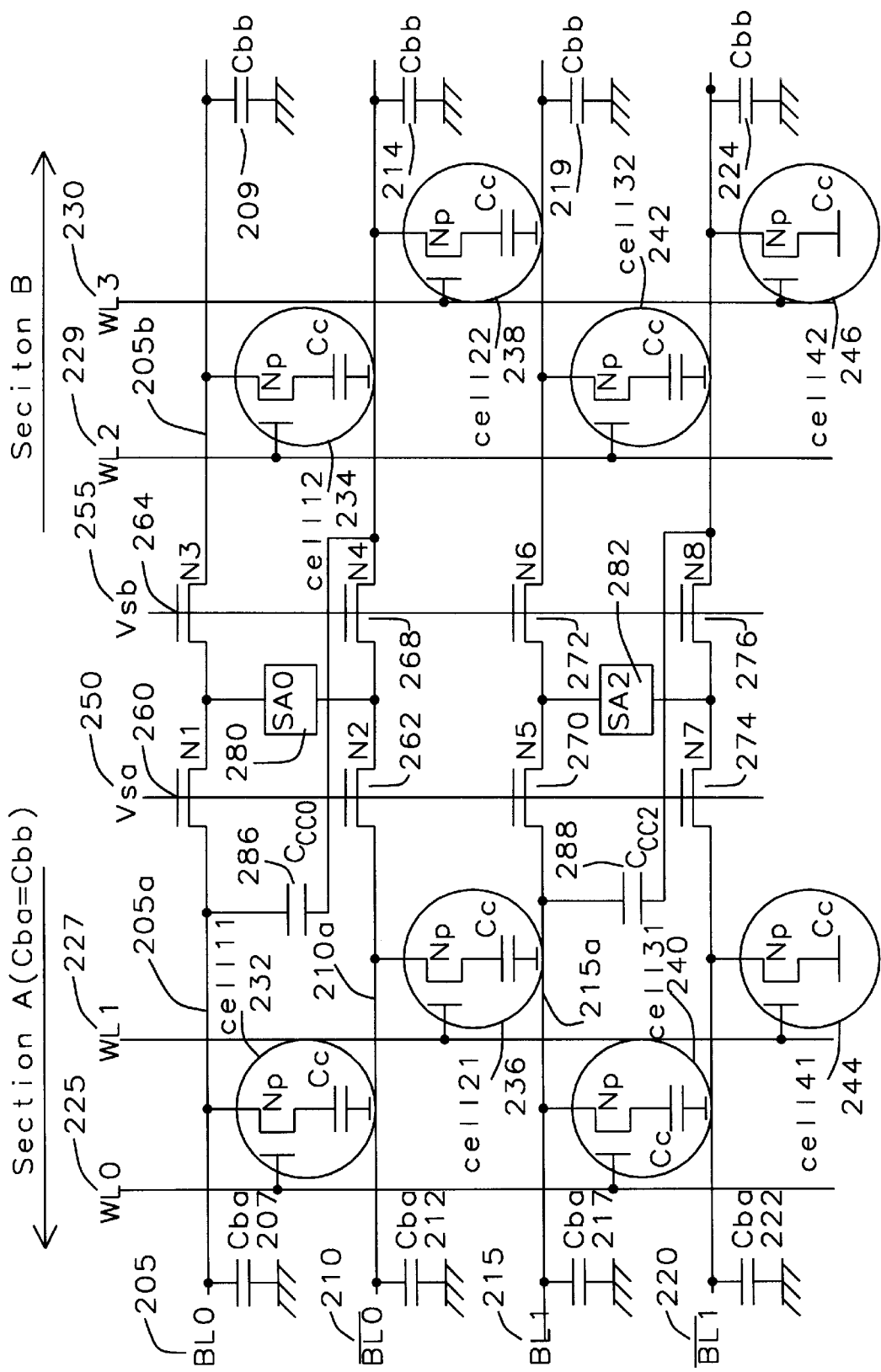
FIG. 4 is a partial schematic drawing of a DRAM array employing the four level sensing scheme of this invention.

A partial array of four level DRAM cells is shown is FIG. 4. The DRAM cells CELL11 232, CELL12 234, CELL21 236, CELL22 238, CELL31 240, CELL32 242, CELL41 244, and CELL42 246 are arranged in rows and columns. Each word line WL0 225, WL1 227, WL2 229, and WL3 230 is attached to the gate of the pass transistor $N_p$ of each DRAM cell cells CELL11 232, CELL12 234, CELL21 236, CELL22 238, CELL31 240, CELL32 242, CELL41 244, and CELL42 246 in a column. Each bit line BL0 205, $\overline{BL0}$ 210, BL1 215, and $\overline{BL1}$ 220 is attached to the source of the pass transistor $N_p$ of each DRAM cell CELL11 232, CELL12 234, CELL21 236, CELL22 238, CELL31 240, CELL32 242, CELL41 244, and CELL42 246 in a row.

The bit lines BL0 205, $\overline{BL0}$ 210, BL1 215, and $\overline{BL1}$ 220 will be divided into two sections, A section and B section, respectively by the pairs of isolation switch transistors $N_1$ 260, $N_2$ 262, $N_3$ 264, $N_4$ 268, $N_5$ 270, $N_6$ 272, $N_7$ 274, and $N_8$ 276. The sense amplifiers SA0 280, and SA1 282 will be connected between the drain connections of the isolation switch transistors $N_1$ 260, $N_2$ 262, $N_3$ 264, $N_4$ 268, $N_5$ 270, $N_6$ 272, $N_7$ 274, and $N_8$ 276.

Cross coupling capacitors $C_{cc0}$ 286, $C_{cc1}$ 288 will be connected between the A section 205a, 210a, and 215a of the bit lines BL0 205, $\overline{BL0}$ 210, and BL1 215 and the B section 210b, 215b, and 220b of the bit lines $\overline{BL0}$ 210, BL1 215, and $\overline{BL1}$ 220.

The word line WL0 225 or the word line WL3 230 will be brought to a voltage level to activate the pass transistors $N_p$ of the DRAM cells CELL11 232, CELL22 238, CELL31 240, and CELL42 246 and the DRAM cells CELL11 232, CELL22 238, CELL31 240, and CELL42 246 will operate as described in FIG. 2. The word line WL1 227 or the word line WL2 229 will be brought to a voltage level to activate the pass transistors $N_p$ of the DRAM cells DRAM cells CELL12 234, CELL21 236, CELL32 242, and CELL41 244 and the DRAM cells DRAM cells CELL12 234, CELL21 236, CELL32 242, and CELL41 244 will operate as described in FIG. 3.

While this invention has been particularly shown and described with reference to the preferred embodiments thereof, it will be understood by those skilled in the art that various changes in form and details may be made without departing from the spirit and scope of the invention.

The invention claimed is:

1. A multi-level sense amplifier structure coupled to a plurality of DRAM cells to detect a level of charge present within one of the DRAM cells and to determine a multiple bit digital data represented by said level of charge, comprising:

a) a first bit line having a first section connected to a first DRAM cell and a second section connected to a second DRAM cell;

b) a second bit line having a first section connected to a third DRAM cell and a second section connected to a fourth DRAM cell;

c) a first isolation switch transistor having a source connected to the first section of the first bit line;

d) a second isolation switch transistor having a source connected to the second section of the first bit line;

e) a third isolation switch transistor having a source connected to the first section of the second bit line;

f) a fourth isolation switch transistor having a source connected to the second section of the second bit line;

g) a latching sense amplifier having a first input connected to a drain of each of the first and second isolation switch transistors, a second input connected to a drain of each of the third and fourth isolation switch transistors, and an output connected to external circuitry, whereby said output will have the digital data represented by the DRAM cells as determined by a voltage level between the first and second inputs;

h) a cross coupling capacitor connected between the first section of the first bit line and the second section of the second bit line to couple a charge shift between the first section of the first bit line and the second section of the second bit line to indicate a low order bit of the digital data; and i) a control logic section connected to the DRAM cells to control selection of each one DRAM cell, the latching sense amplifier to control activation of said sense amplifier, a gate of each of the first, second, third, and fourth isolation switch transistors to control activation and deactivation of the first, second, third, and fourth isolation switch transistors.

2. The multi-level sense amplifier structure of claim 1 wherein the level of charge is one of four levels of charge representing two bits of digital data.

3. The multi-level sense amplifier structure of claim 1 wherein the level of charge present within one DRAM cell is determined by:

a) initializing the first and second bit lines by placing the first, second, third, and fourth isolation switch transistors in an on state and precharging said first and second bit lines to a level that is one half a power supply voltage source during a standby time;

b) activating the one of the DRAM cell to transfer the level of charge present on said one DRAM cell to a bit line attached to said one DRAM cell;

c) deactivating a pair of isolation switch transistors connected to an opposite section of the first and second bit lines attached to said one DRAM cell to place said pair of isolation switch transistors in an off state;

d) activating the latching sense amplifier to sense the level of charge at the section of the bit line attached to the one DRAM cell;

e) placing a high order sensed data bit at the output of said latching sense amplifier representing the level of charge present within said DRAM cell;

f) placing a first voltage level that represents the high order sensed data bit on the section of the bit line attached to the one DRAM cell;

g) coupling through the cross coupling capacitor a charge shift from the section attached to the one DRAM cell to the opposite section of the bit line not attached to the one DRAM cell to indicate the level of the high order sense data bit;

h) deactivating the pair of isolation switch transistors connected to the section of the first and second bit lines attached to said one DRAM cell to place said pair of isolation switch transistors in an off state;

i) activating the pair of isolation switch transistors connected to an opposite section of the first and second bit lines attached to said DRAM cell to place said pair of isolation switch transistors in an on state;

j) activating the latching sense amplifier to sense the level of charge at the section of the bit line not attached to the one DRAM cell;

k) placing a low order sensed data bit at the output of said latching sense amplifier representing the level of charge present within said one DRAM cell;

l) placing a second voltage level that represents the low order sensed data bit on the section of the bit line not attached to the one DRAM cell;

m) deactivating the latching sense amplifier;

n) activating the first, second, third, and fourth isolation switch transistors to restore the level of charge to the DRAM cell; and o) deactivating the one DRAM cell.

4. The multi-level sense amplifier structure of claim 1 wherein the cross coupling capacitor is a size that is one third of the capacitance of a cell capacitance of the one DRAM cell.

5. A DRAM array capable of retaining multiple bits of digital data represented by a level of charge within a single memory cell, comprising:

a) a plurality of memory cells arranged in rows and columns;

b) a plurality of word lines whereby each word line is placed at each column of the plurality of memory cells and connected to each memory cell to control transferring the level of charge to the memory cell;

c) a plurality of bit lines whereby each bit line is placed at each row of the plurality of memory cells and connected to each memory cell to provide the level of charge to each memory cell;

d) a plurality of isolation switch transistors whereby a pair of isolation switch transistors is placed on each bit line to divide each bit line into a first section and a second section;

e) a plurality of cross coupling capacitors, whereby each cross coupling capacitor is connected between the first section of one bit line and the second section of an adjacent bit line; and f) a plurality of sense amplifiers, whereby each sense amplifier is connected between each pair of isolation switch transistor of the one bit line and between each pair of isolation switch transistor of the adjacent bit line.

6. The DRAM array of claim 5 wherein the level of charge is one of four levels of charge representing two bits of digital data.

7. The DRAM array of claim 5 wherein the level of charge present within one memory cell is determined by:

a) initializing the bit lines by placing the isolation switch transistors in an on state and precharging said bit lines to a level that is one half a power supply voltage source during a standby time;

b) activating one of the memory cell to transfer the level of charge present on said one memory cell to a bit line attached to said one memory cell;

c) deactivating one pair of isolation switch transistors connected to an opposite section of the bit line attached to said one memory cell and of an adjacent bit line to place said pair of isolation switch transistors in an off state;

d) activating a latched sense amplifier to sense the level of charge at the section of the bit line attached to the one memory cell;

e) placing a high order sensed data bit at the output of said latched sense amplifier representing the level of charge present within said memory cell;

f) placing a first voltage level that represents the high order sensed data bit on the section of the bit line attached to the one memory cell;

g) coupling through the cross coupling capacitor a charge shift from the section attached to the one memory cell to the opposite section of the adjacent bit line to indicate the level of the high order sense data bit;

h) deactivating a pair of isolation switch transistors connected to the section of the bit line attached to said one memory cell and of the adjacent bit line to place said pair of isolation switch transistors in an off state;

i) activating the pair of isolation switch transistors connected to the opposite section of the bit line attached to said memory cell and of the adjacent bit line to place said pair of isolation switch transistors in an on state;

j) activating the latched sense amplifier to sense the level of charge at the section of the bit line not attached to the one memory cell;

k) placing a low order sensed data bit at the output of said latched sense amplifier representing the level of charge present within said one memory cell;

l) placing a second voltage level that represents the low order sensed data bit on the section of the bit line not attached to the one memory cell;

m) deactivating the latched sense amplifier;

n) activating the isolation switch transistors to restore the level of charge to the memory cell; and o) deactivating the one memory cell.

8. The DRAM array of claim 5 wherein the cross coupling capacitor is a size that is one third of the capacitance of a cell capacitance of the memory cell.

9. A method for sensing a level of charge within a DRAM cell and determining a digital data value represented by said level of charge, comprising the steps of:

a) providing a multi-level sense amplifier structure coupled to said DRAM cell to detect the level of charge present within the DRAM cell and to determine the digital data value represented by said level of charge, whereby said multilevel sense amplifier structure includes:

a first bit line having a first section connected to a first DRAM cell and a second section connected to a second DRAM cell;

a second bit line having a first section connected to a third DRAM cell and a second section connected to a fourth DRAM cell;

a first isolation switch transistor having a source connected to the first section of the first bit line;

a second isolation switch transistor having a source connected to the second section of the first bit line;

a third isolation switch transistor having a source connected to the first section of the second bit line;

a fourth isolation switch transistor having a source connected to the second section of the second bit line;

a latching sense amplifier having a first input connected to a drain of each of the first and second isolation switch transistors, a second input connected to a drain of each of the third and fourth isolation switch transistors, and an output connected to external circuitry, whereby said output will have the digital data value represented by the DRAM cells as determined by a voltage level between the first and second inputs;

a cross coupling capacitor connected between the first section of the first bit line and the second section of the second bit line to couple a charge shift between the first section of the first bit line and the second section of the second bit line to indicate a low order bit of the digital data; and a control logic section connected to the DRAM cells to control selection of each one DRAM cell, the latching sense amplifier to control activation of said sense amplifier, a gate of each of the first, second, third, and fourth isolation switch transistors to control activation and deactivation of the first, second, third, and fourth isolation switch transistors;

b) initializing the first and second bit lines by placing the first, second, third, and fourth isolation switch transistors in an on state and precharging said first and second bit lines to a level that is one half a power supply voltage source during a standby time;

c) activating the DRAM cell to transfer the level of charge present on said DRAM cell to a bit line attached to said DRAM cell;

d) deactivating the a pair of isolation switch transistors connected to an opposite section of the first and second bit lines attached to said DRAM cell to place said pair of isolation switch transistors in an off state;

e) activating the latching sense amplifier to sense the level of charge at the section of the bit line attached to the DRAM cell;

f) placing a high order sensed data bit at the output of said latching sense amplifier representing the level of charge present within said DRAM cell;

g) placing a first voltage level that represents the high order sensed data bit on the section of the bit line attached to the DRAM cell;

h) coupling through the cross coupling capacitor a charge shift from the section attached to the DRAM cell to the opposite section of the bit line not attached to the DRAM cell to indicate the level of the high order sense data bit;

i) deactivating the pair of isolation switch transistors connected to the section of the first and second bit lines attached to said DRAM cell to place said pair of isolation switch transistors in an off state;

j) activating the pair of isolation switch transistors connected to an opposite section of the first and second bit lines attached to said DRAM cell to place said pair of isolation switch transistors in an on state;

k) activating the latching sense amplifier to sense the level of charge at the section of the bit line not attached to the DRAM cell;

l) placing a low order sensed data bit at the output of said latching sense amplifier representing the level of charge present within said DRAM cell;

m) placing a second voltage level that represents the low order sensed data bit on the section of the bit line not attached to the DRAM cell;

n) deactivating the latching sense amplifier;

o) activating the first, second, third, and fourth isolation switch transistors to restore the level of charge to the DRAM cell; and p) deactivating the DRAM cell.

10. The method of claim 9 wherein the level of charge is one of four levels of charge representing two bits of digital data.

11. The method of claim 9 wherein the cross coupling capacitor is a size that is one third of the capacitance of a cell capacitance of the DRAM cell.

* * * * *